US006861887B2

(12) United States Patent
Jeong et al.

(10) Patent No.: US 6,861,887 B2
(45) Date of Patent: Mar. 1, 2005

(54) CLOCKED-SCAN FLIP-FLOP FOR MULTI-THRESHOLD VOLTAGE CMOS CIRCUIT

(75) Inventors: Kwang-ok Jeong, Seoul (KR); Hyo-sig Won, Kyoungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/330,427

(22) Filed: Dec. 30, 2002

(65) Prior Publication Data

US 2004/0021493 A1 Feb. 5, 2004

(30) Foreign Application Priority Data

Jul. 31, 2002 (KR) ........................................ 2002-45329

(51) Int. Cl.[7] .............................................. H03K 3/289
(52) U.S. Cl. ........................ 327/202; 327/203; 327/197
(58) Field of Search ................................ 327/202, 203, 327/197, 198, 199, 200, 206, 208, 211, 213, 219; 371/22.3

(56) References Cited

U.S. PATENT DOCUMENTS

| | | | | |
|---|---|---|---|---|
| 5,717,700 | A | * 2/1998 | Crouch et al. | 371/22.3 |
| 5,719,878 | A | * 2/1998 | Yu et al. | 271/22.3 |
| 6,492,854 | B1 | * 12/2002 | Ku et al. | 327/202 |
| 6,566,927 | B2 | * 5/2003 | Park et al. | 327/211 |

2002/0047737 A1 4/2002 Park et al.

OTHER PUBLICATIONS

Shin'ichiro Mutoh, Satoshi Shigematsu, Yasuyuki Matsuya, Hideki Fukuda, Takao Kaneko, and Junzo Yamada, "A 1–V Multithreshold–Voltage CMOS Digital Signal Processor for Mobile Phone Application," Nov., 1996, vol. 31, No. 11, pp. 1795–1802.

* cited by examiner

*Primary Examiner*—My-Trang Nu Ton
*Assistant Examiner*—Hiep Nguyen
(74) *Attorney, Agent, or Firm*—Harness, Dickey & Pierce, P.L.C.

(57) ABSTRACT

A clocked-scan flip-flop for multi-threshold CMOS (MTCMOS) is provided. The clocked-scan flip-flop includes a first switching unit which switches normal data that are input from the outside and outputs the data; a second switching unit which switches scan data that are input from the outside and outputs the data; a latch unit which latches the data input from the first switching unit or the second switching unit; and a clock input unit which controls the switching operations of the first and second switching units according to the result of a predetermined operation on a clock signal and a scan clock signal that are input from the outside. The clocked-scan flip-flop has the characteristics of a complementary pass-transistor (CP) flip-flop, that is, low power consumption and high performance. Also, the clocked-scan flip-flop provides a full-scale scan function for test purposes.

17 Claims, 6 Drawing Sheets

FIG. 2

| SCAN INPUT | SCK | D | CLOCK | Q(n+1) | QB(n+1) |
|---|---|---|---|---|---|
| X | 0 | 0 | ↗ | 0 | 1 |
| X | 0 | 1 | ↙ | 1 | 0 |
| 0 | ↗ | X | 0 | 0 | 1 |
| 1 | ↙ | X | 0 | 1 | 0 |
| X | 0 | X | ↗ | Q(n) | QB(n) |
| X | ↙ | X | 0 | Q(n) | QB(n) |

FIG. 5

| SCK | CLOCK | Y |
|---|---|---|
| 0 | 0 | 0 |
| 0 | 1 | 0 |
| 1 | 0 | 1 |
| 1 | 1 | 0 |

CLOCKED-SCAN FLIP-FLOP FOR MULTI-THRESHOLD VOLTAGE CMOS CIRCUIT

CROSS-REFERENCE TO RELATED APPLICATION

This application claims priority upon Korean Patent Application No. 02-45329, filed Jul. 31, 2002, the entirety of which is hereby incorporated by reference.

BACKGROUND OF THE INVENTION

1. Field of the Invention

The present invention relates to a semiconductor integrated circuit (IC), and more particularly, to a scan flip-flop for a multi-threshold voltage CMOS circuit.

2. Description of the Related Art

In order to increase the integration of a semiconductor device, demands for a low power consumption semiconductor IC have gradually increased. An effective method for implementing a low power consumption semiconductor IC is reducing power supply voltage. However, reducing the power supply voltage causes lowered speeds of transistors. To solve this problem, a multi-threshold voltage CMOS IC that comprises a MOS transistor having a low threshold voltage and a MOS having a high threshold voltage is used.

FIG. 1 is a diagram of the structure of an ordinary multi-threshold voltage CMOS (MTCMOS) circuit. The MTCMOS circuit 10 shown in FIG. 1 is disclosed in an article, "A 1-V Multi-threshold-Voltage CMOS Digital Signal Processor for Mobile Phone Application" of S. Mutoh et al., 1996, IEEE JSSC, Vol. 31, No. 11, pp. 1795–1802.

Referring to FIG. 1, the MTCMOS circuit 10 comprises MOS switches Q1 and Q2 that are serially connected between power source (VDD or GND) and a logic circuit 12. These MOS switches Q1 and Q2 have relatively high threshold voltage Vth. The MOS switches Q1 and Q2 are turned on when the circuit 10 operates (that is, the circuit 10 is in an active mode), and provide power source voltage to the logic circuit 12 having a relatively low threshold voltage. When the circuit 10 does not operate (that is, the circuit 10 is in a sleep mode), the MOS switches Q1 and Q2 are turned off such that power source voltage is not provided to the logic circuit 12. Thus, the leakage current (for example, sub-threshold current, etc.) of the logic circuit 12 decreases such that the power consumption of the entire system is minimized. Accordingly, the MTCMOS technology is very effectively used in reducing power consumption of large scale integration (LSI) circuits for portable devices in which sleep mode intervals are much longer than active mode intervals. However, the MTCMOS technology causes loss of data stored in latches or flip-flops of the logic circuit when the power is turned off.

To solve this problem, new technologies, such as a balloon flip-flip, auto backgate controlled (ABC)-MTCMOS, a virtual power/ground rail clamp (VRC), and a complementary pass-transistor flip-flop (CPFF), have been proposed. Among these, the CPFF technology, which was disclosed in Korean Patent Application No. 10-2001-0029730 filed by the present applicant on May 29, 2001, enables the MTCMOS to have better quality than other flip-flops in chip area, speed, and power consumption. In particular, the CPFF circuit needs neither a surplus data storage space for storing data in a sleep mode, nor any timing control. In addition, the CPFF has a smaller clock load and a smaller layout area such that high integration of the CPFF is enabled.

However, since the above circuits do not consider design for test (DFT) in their design stage, the circuits cannot apply a clocked-scan function in which a test is performed after receiving a clock signal dedicated for a scan-chain.

Accordingly, as described above, needed is a scan flip-flop having a new structure for an MTCMOS, which can provide the clocked-scan function while maintaining an optimal circuit structure and performance for an MTCMOS.

SUMMARY OF THE INVENTION

An embodiment of the present invention provides a clocked-scan flip-flop comprising: a first switching unit which receives and switches externally-provided normal data and outputs the normal data; a second switching unit which receives and switches externally-received scan data and outputs the scan data; a latch unit which latches the scan data input from the first switching unit or the scan data from the second switching unit; and a clock input unit which controls the switching operations of the first and second switching units according to the result of a predetermined operation on an externally-provided clock signal and an externally-provided scan clock signal.

An embodiment of the present invention provides a multi-threshold flip-flop circuit comprising: a data input unit to invert externally-provided data, the data input unit including low-threshold devices; a latch unit to latch data from the data input unit, the latch unit including high-threshold devices; and a data output unit to output data latched by the latch unit, the data output unit including low-threshold devices.

Additional features and advantages of the invention will be more fully apparent from the following detailed description of example embodiments, the appended claims and the accompanying drawings.

BRIEF DESCRIPTION OF THE DRAWINGS

The above object and advantages of the present invention will become more apparent by describing in detail preferred embodiments thereof with reference to the attached drawings in which:

FIG. 2 is a truth table of a clocked-scan flip-flop according to an embodiment of the present invention;

FIG. 5 is a truth table of a short prevention unit shown in FIG. 4; and

DESCRIPTION OF THE PREFERRED EMBODIMENTS

Figure 1:
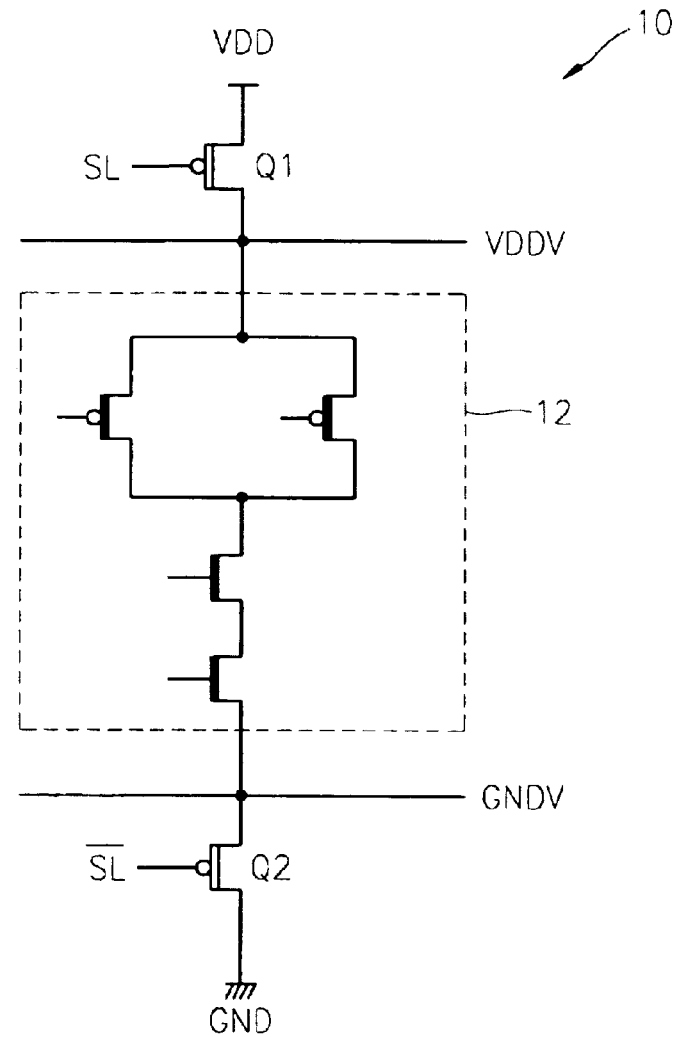
FIG. 1 is a diagram of the structure of a multi-threshold voltage CMOS (MTCMOS) circuit according to the Background Art.
Figure 1:
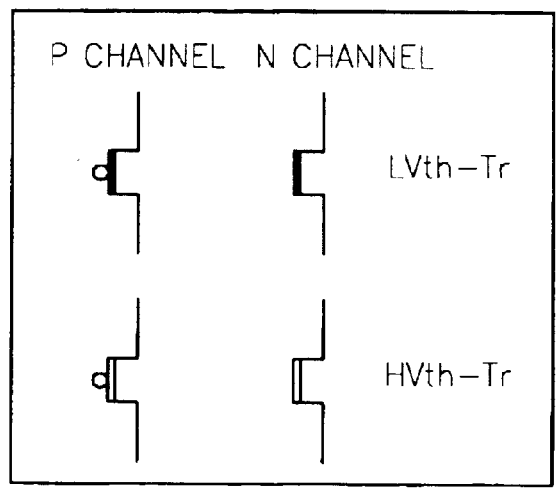
Figure 3:
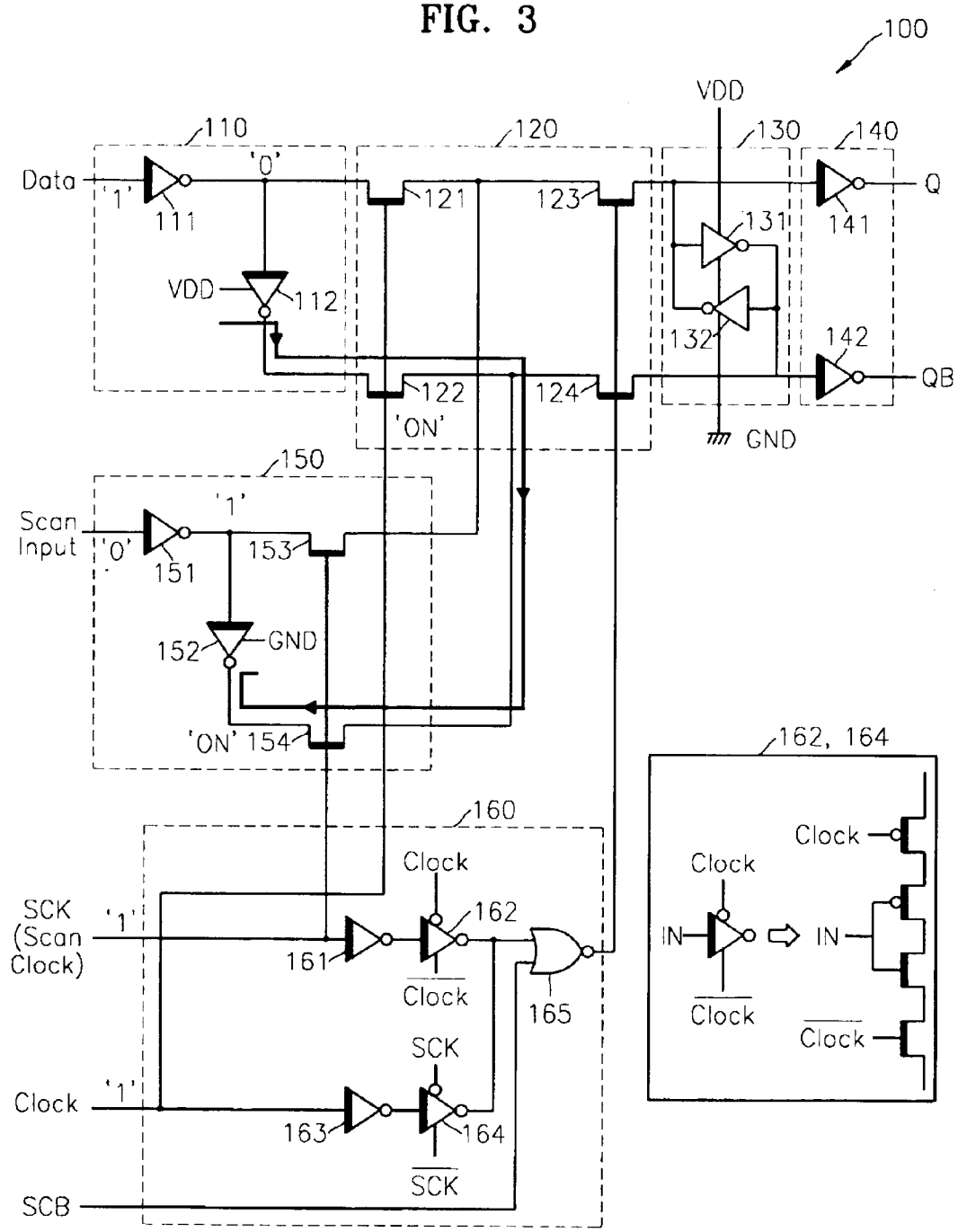
FIG. 3 is a circuit diagram of a clocked-scan flip-flop according to an embodiment of the present invention, the flip-flop satisfying the truth table shown in FIG. 2.

First, referring to FIG. 3, the clocked-scan flip flop 100 according to an embodiment of the present invention comprises a data input unit 110, a switching unit 120, a latch unit 130, a data output unit 140, a scan data input unit 150, and a clock input unit 160.

The data input unit 110 comprises a first inverter 111 and a second inverter 112 that have low thresholds. The first inverter 11 receives data (Data) that are input from the outside, inverts the data, and then outputs the result. The second inverter 112 inverts the output of the first inverter 111, and then outputs the result.

The switching unit 120 comprises a first MOS switch 121 through a fourth MOS switch 124 having low thresholds. An end of the first MOS switch 121 is connected to the output of the first inverter 111 and an end of the second MOS switch 122 is connected to the output of the second inverter 112. A clock signal (Clock) is provided to the gates of the first and second MOS switches 121 and 122 such that the operations of the switches 121 and 122 are controlled. An end of the second MOS switch 123 is connected to the output of the first MOS switch 121 and an end of the fourth MOS switch 124 is connected to the output of the first MOS switch 122. The output signal of the clock input unit 160 is provided to the gates of the third and fourth MOS switches 123 and 124 such that the operations of the switches 123 and 124 are controlled.

The latch unit 130 comprises a first inverter 131 and a second inverter 132 having high threshold voltages. The first inverter 131 is connected to the other end of the third MOS switch 123 and inverts the output of the third MOS switch 123. The second inverter 132 is connected to the other end of the fourth MOS switch 124 and the output of the first inverter 131, and inverts the output of the first inverter 131 and feeds back the inverted data to the input terminal of the first inverter 131. Power source voltage (VDD<1), which is the actual power supply source, and ground (GND) are provided to the first inverter 131 and 132, respectively.

The data output unit 140 comprises a third inverter 141 and a fourth inverter 144 having low threshold voltages. The third inverter 141 is connected to the output of the second inverter 132 of the latch unit 130, and inverts the data latched in the latch unit 130 and outputs the result. The fourth inverter 142 is connected to the output of the first inverter 131 of the latch unit 130, and inverts the data latched in the latch unit 130 and outputs the result.

The scan data input unit 150 comprises a fifth inverter 151 and a sixth inverter 152 having low threshold voltages and a fifth MOS switch 153 and a sixth MOS switch 154 having low threshold voltages. The fifth inverter 151 inverts scan data (Scan Input) that are input from the outside in testing, and outputs the result. The sixth inverter 152 is connected to the output of the fifth inverter 151, and inverts data output from the fifth inverter 151 and outputs the result. An end of the fifth MOS switch 153 is connected to the output terminal of the fifth inverter 151 and the other end is connected between the first MOS switch 121 and the third MOS switch 123. An end of the sixth MOS switch 154 is connected to the output terminal of the sixth inverter 152 and the other end is connected between the second MOS switch 122 and the fourth MOS switch 124. A scan clock signal (SCK) is provided to the gates of the fifth and sixth MOS switches 153 and 154 so that the input of scan data in testing can be switched.

The clock input unit 160 comprises a seventh inverter 161 and an eighth inverter 163 having low threshold voltages, a first controlled-inverter 162 and a second controlled-inverter 164 having low threshold voltages, and a NOR gate 165 having a high threshold voltage. The seventh inverter 161 inverts the scan clock signal (SCK) input from the outside and outputs the result. The first controlled-inverter 162 receives the inverted scan clock signal ($\overline{SCK}$) that is output from the seventh inverter 161, as an input signal, receives the clock signal (Clock) and the inverted clock signal ($\overline{Clock}$) as control signals, and inverts the input signal ($\overline{SCK}$) and outputs the result, that is, the signal SCK. The eighth inverter 163 inverts the clock signal (Clock) input from the outside and outputs the result.

The second controlled-inverter 164 receives the inverted clock signal ($\overline{Clock}$) that is output from the eighth inverter 163, as an input signal, receives the scan clock signal ($\overline{SCK}$) and the inverted scan clock signal (SCK) as control signals, and inverts the input signal ($\overline{Clock}$) and outputs the result, that is, the signal Clock. The NOR gate 165 receives the output signals of the first and second inverters 162 and 164 and a data input cutoff signal (SCB) having a phase opposite to that of the clock signal (Clock) and performs a NOR operation on the signals, and outputs the result to the gates of the third and fourth MOS switches 123 and 124. Here, the first and second inverters 162 and 164 have the circuit structure shown in the box in the right hand corner of FIG. 3 and perform a function which prevents two clock signals from operating at the same time.

Referring to the truth table of the clocked-scan flip-flop shown in FIG. 2, the scan clock signal (SCK) is '0' when a normal operation is performed. If the scan clock signal (SCK) is '0', the second controlled-inverter 164 operates as an inverter and the waveform of the clock signal (Clock) is output without change as the output of the second controlled-inverter 164. Accordingly, the waveform of the clock signal (Clock) is transferred to the input terminal of the NOR gate 165 without change.

A method for cutting off the input of the scan clock signal (SCK) and the scan data (Scan Input) in a normal operation will now be explained, first from more details of the operation of the normal clock signal (Clock).

When the clock signal (Clock) is '0', the first controlled-inverter 162 operates as an inverter as the second controlled-inverter 164 does. Here, by the scan clock signal (SCK) having a value '0', the output of the first controlled-inverter 162 becomes '0' and the clock signal (Clock) having a value '0' is input to the NOR gate 165 without change. When the clock signal (Clock) is '1', the operation of the first controlled-inverter 162 is cut off and the value of the scan clock signal (SCK) is not output through the first controlled-inverter 162 any more. Accordingly, as described above, only the waveform of the clock signal (Clock) is input to the input terminal of the NOR gate 165.

When the scan clock signal (SCK) is '0', that is, when a normal operation is performed, the scan clock signal (SCK) having a value '0' turns off the fifth and sixth MOS switches 153 and 154 that switch the input of the scan data (Scan Input) so that the scan input data (Scan Input) are not transferred to the latch unit 130. In this state where the scan input data (Scan Input) and the scan clock signal (SCK) are cut off, the first MOS switch 121/the second MOS switch 122 and the third MOS switch 123/the fourth MOS switch 124 sequentially operate according to the delays of the eighth inverter 163, the second controlled-inverter 164, and the NOR gate such that the input data (Data) are stored in the latch unit 130.

Meanwhile, when the clocked-scan flip-flop 100 according to the present invention performs a scan operation, the clock signal (Clock) is '0'. If the clock signal (Clock) is '0', the first controlled-inverter 162 operates as an inverter and the waveform of the scan clock signal (SCK) is output without change as the output of the first controlled-inverter 162. As a result, the waveform of the scan clock signal (SCK) is transferred to the input terminal of the NOR gate 165 without change. Accordingly, the third and fourth MOS switches 123 and 124 that switch the data input of the latch unit 130 are synchronized to the scan clock signal (SCK) and perform switching operations. Here, the scan clock signal (SCK) provided to the clock input unit 160 is '1' and by the scan clock signal (SCK) having a value '1', the fifth and sixth MOS switches 153 and 154 are turned on. As a result, the scan data (Scan Input) that are input through the fifth and sixth MOS switches 153 and 154 are transferred to the third and fourth MOS switches 123 and 124, and by the switching operations of the third and fourth MOS switches 123 and 124, the scan data (Scan Input) are transferred to the latch unit 130.

Figure 4:
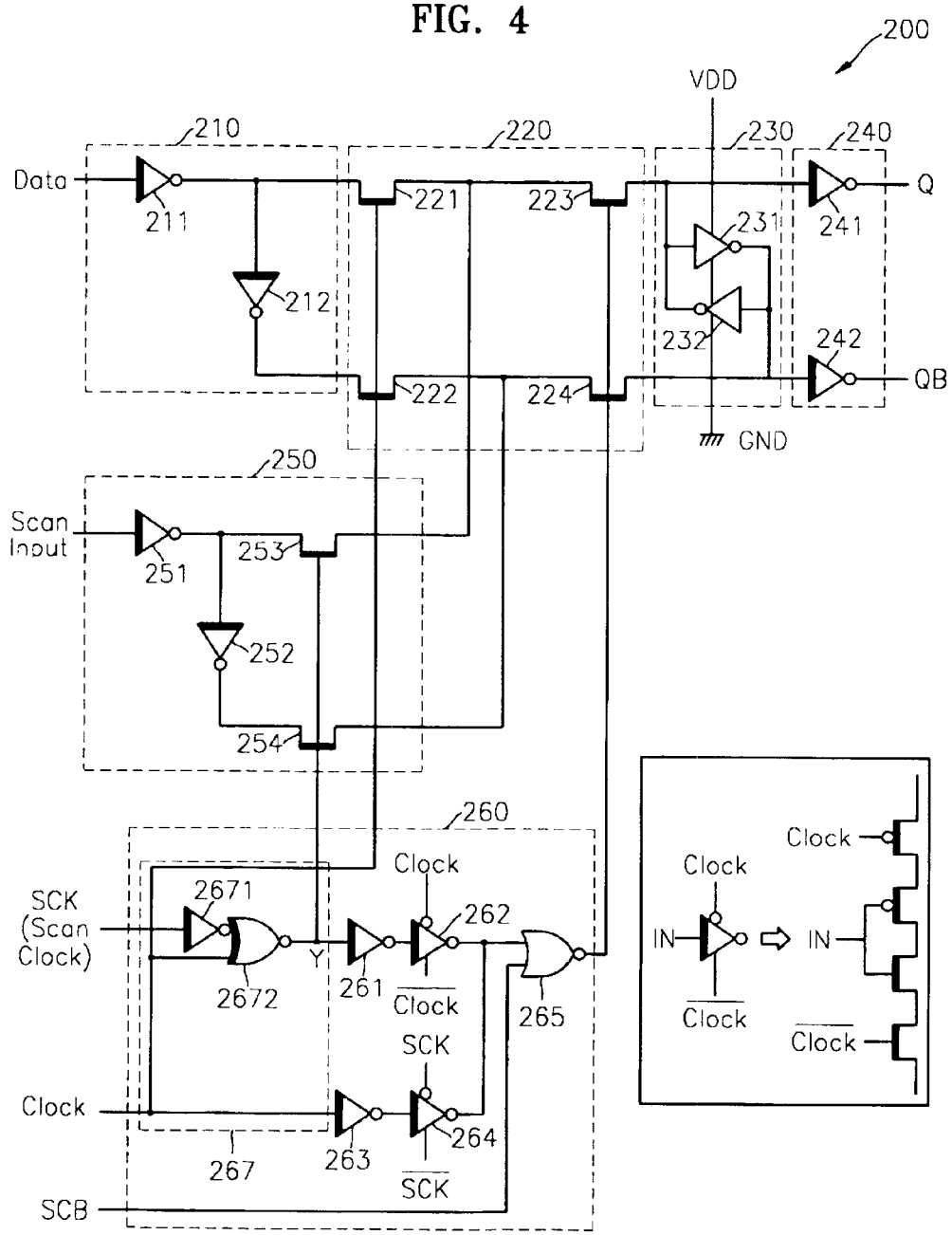
FIG. 4 is a circuit diagram of a clocked-scan flip-flop according to an embodiment of the present invention.

FIG. 4 is the circuit diagram of a clocked-scan flip-flop according to another embodiment of the present invention. The clocked-scan flip-flop 200 shown in FIG. 4 has the same circuit structure as that of the clocked-scan flip-flop flop 100 shown in FIG. 3, except that the clocked-scan flip-flop 200 has a short prevention unit 267 in the clock input unit 260. Therefore, for simplification of explanation, redundant explanation on the functional blocks having the same circuit structure will be omitted.

Referring to FIG. 4, the clock input unit 260 comprises a current prevention unit 267 which prevents a short current that may happen when both the clock signal (Clock) and the scan clock signal (SCK) are '1'; a seventh inverter 261 which receives the output signal (Y) of the short prevention unit 267; a first controlled-inverter 262 which is connected to the output terminal of the seventh inverter 261; an eighth inverter 263 which receives the clock signal (Clock) that is input from the outside; a second controlled-inverter 264 which is connected to the output terminal of the eighth inverter 263; and an NOR gate 265 which receives the output signals of the first and second controlled-inverters 262 and 264 and performs a NOR operation on the received signals.

The short prevention unit 267 comprises an inverter 2671 having a low threshold voltage and a NOR gate 2672 having a high threshold voltage. The inverter 2671 inverts the scan clock signal (SCK) that is provided from the outside and outputs the result. The NOR gate 2672 receives the output signal of the inverter 2671 and the clock signal (Clock) that is input from the outside, and performs a NOR operation on the signals. The seventh inverter 2671 receives the output signal (Y) of the short prevention unit 267, instead of directly receiving the scan clock signal (SCK) as an input signal. The operation performed in the short prevention unit 267 will now be explained.

Figure 5:
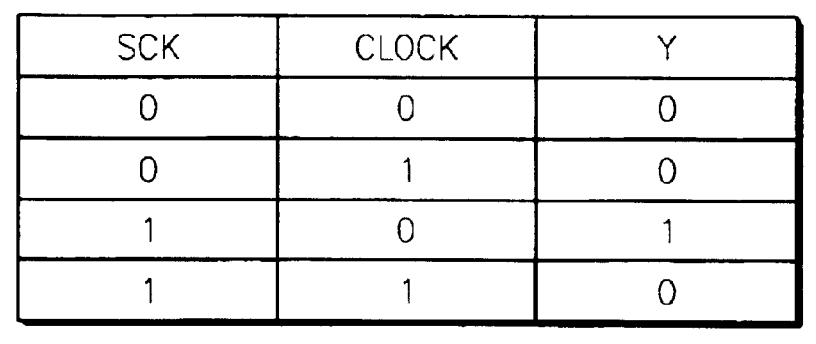

FIG. 5 is a truth table of a short prevention unit shown in FIG. 4. Referring to FIG. 5, the short prevention unit 267 receives the scan clock signal (SCK) that is input from the outside, and outputs the signal (SCK). However, the short prevention unit 267 outputs the signal (SCK) without change only when only the scan clock signal (SCK) is '1', as shown in the truth table of FIG. 4. This is to prevent a short current that may happen when both the clock signal (Clock) and the scan clock signal (SCK) are '1'. Problems that can happen when a clocked-scan flip-flop does not comprise the short prevention unit 267 will now be explained.

Referring to FIG. 3, for example, when both the clock signal (Clock) and the scan clock signal (SCK) are '1', the first and second MOS switches 121 and 122 and the fifth and sixth MOS switches 153 and 154 are all turned on. At this time, if the input data (Data) is '1', the output of the first inverter 111 is '0', and by this value '0', a PMOS transistor (not shown) of the second inverter 112 is turned on.

As a result, as the arrows on the straight lines of FIG. 3, a short current occurs from the power source voltage (VDD) and passes through the PMOS transistor of the second inverter 112, the second and sixth MOS switches 122 and 154, and the NMOS transistor of the sixth inverter 152, to the ground (GND).

However, if the clock input unit 260 comprises the short prevention unit 267 as shown in FIG. 4, the short current is prevented. The prevention of a short current will now be explained.

Referring again to FIG. 4, first, the clock input unit 260 receives the scan clock signal (SCK) through the short prevention unit 267. At this time, if both the scan clock signal (SCK) and the clock signal (Clock) are '1', the inverter 2671 of the short prevention unit 267 outputs a signal having a value '0'. Accordingly, the output of the NOR gate 2672 is '0' and both the fifth MOS switch 253 and the sixth MOS switch 256 are cut off. Therefore, the short current that begins from the power source voltage (VDD) and passes through the PMOS transistor of the second inverter 112, the second and sixth MOS switches 122 and 154, and the NMOS transistor of the sixth inverter 152, directly to the ground (GND), is prevented.

However, the short prevention unit 267 shown in FIG. 4 may be a circuit which is not needed functionally according to the truth table of the clocked-scan flip-flop shown in FIG. 2. That is, even without the short prevention unit 267, the clocked-scan flip-flop circuit can perform all functions of the truth table shown in FIG. 2. However, since if both the scan clock signal (SCK) and the clock signal (CLK) are '1', a short current may happen as described above, in order to prevent the short current the short prevention unit 267 is additionally inserted in the clock input unit 260 as shown in FIG. 4.

Figure 6:
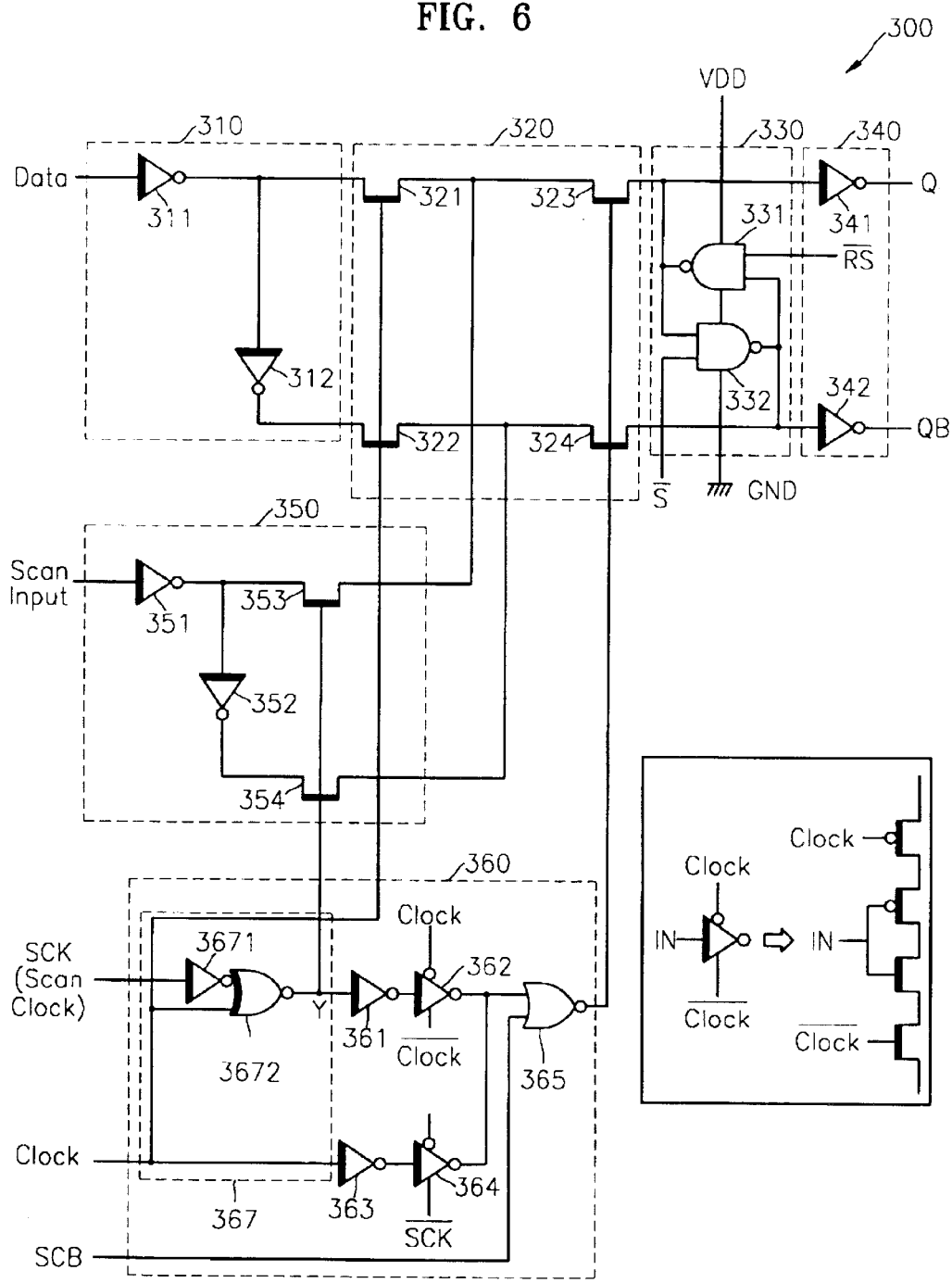
FIG. 6 is a circuit diagram of a clocked-scan flip-flop according to an embodiment of the present invention.

FIG. 6 is a circuit diagram of a clocked-scan flip-flop 300 according to another embodiment of the present invention. The clocked-scan flip-flop 300 shown in FIG. 6 adds an asynchronous set/reset function to the clocked-scan flip-flop 200 shown in FIG. 4. The clocked-scan flip-flop 300 has the same circuit structure as that of the clocked-scan flip-flop 200 shown in FIG. 4, except that the clocked-scan flip-flop 300 comprises a latch unit 330 employing NAND gates 331 and 332 instead of inverters. Therefore, for simplification of explanation, redundant explanation on the functional blocks having the same circuit structure will be omitted.

Referring to FIG. 6, the latch unit 330 comprises a first NAND gate 331 and a second NAND gate 332 having high threshold voltages. The first NAND gate 331 receives data input from a fourth MOS switch 324 and a reset signal ($\overline{RS}$) that is input from the outside, and performs a NAND operation on the signals. The second NAND gate 332 receives the NAND operation result output from the first NAND gate 331 and a set signal ($\overline{S}$) that is input from the outside, performs a NAND operation on the signals, and feeds back the operation result to the input of the first NAND gate 331. In the latch unit 330, an operation for latching data may be directly controlled by an asynchronous input and by this method a set flip-flop and a reset flip-flop can be implemented.

Some embodiments have been explained above and are shown. However, the present invention is not restricted to the above-described embodiments and many variations are possible within the spirit and scope of the present invention. The scope of the present invention is not determined by the above description but by the accompanying claims.

As described above, the MTCMOS clocked-scan flip-flop according to embodiments of the present invention has the characteristics of a complementary pass-transistor (CP) flip-flop, that is, low power consumption and high performance. Also, the clocked-scan flip-flop provides a full-scale scan function for test purposes.

What is claimed is:

1. A clocked-scan flip-flop comprising:
   a first switching unit which receives and switches externally-provided normal data and outputs the normal data;
   a second switching unit which receives and switches externally-received scan data and outputs the scan data;
   a latch unit which latches the normal data input from the first switching unit or the scan data from the second switching unit; and
   a clock input unit which controls the switching operations of the first and second switching units according to the result of a predetermined operation on an externally-provided clock signal and an externally-provided scan clock signal;
   the latch unit including devices having relatively higher threshold voltages, and the first and second switching units including devices having relatively lower threshold voltages.

2. The clocked-scan flip-flop of claim 1, wherein the first switching unit comprises:
   a first switch which, in response to the clock signal, switches the normal data;
   a second switch which, in response to the clock signal, switches the inverted normal data;
   a third switch which, in response to the predetermined operation of the clock input unit, selectively outputs the output of the first switch to the latch unit; and
   a fourth switch which in response to the predetermined operation of the clock input unit selectively outputs the output of the second switch to the latch unit.

3. The clocked-scan flip-flop of claim 2, wherein the second switching unit comprises:
   a fifth switch which, in response to the scan clock signal, outputs the scan data to the third switch; and
   a sixth switch which, in response to the scan clock signal, outputs the inverted scan data to the fourth switch.

4. The clocked-scan flip-flop of claim 3, wherein the first through sixth switches are devices having low threshold values.

5. The clocked-scan flip-flop of claim 1, wherein the latch unit comprises devices having high threshold voltages.

6. The clocked-scan flip-flop of claim 1, wherein the latch unit is directly connected to a power source voltage and ground.

7. The clocked-scan flip-flop of claim 1, wherein the clock input unit comprises:
   a first inverter which inverts the scan clock signal;
   a first controlled-inverter which receives the output of the first inverter as an input and receives the clock signal and an inverted clock signal as control signals;
   a second inverter which inverts the clock signal;
   a second controlled-inverter which receives the output of the second inverter as an input and receives the scan clock signal and an inverted scan clock signal as control signals; and
   a NOR gate which performs a NOR operation on the outputs of the first and second controlled-inverters and a data input cutoff signal having a phase opposite to the phase of the clock signal.

8. The clocked-scan flip-flop of claim 3, wherein the clock input unit further comprises a short prevention unit which controls the switching operations of the fifth and sixth switches in response to the result of a predetermined logic operation on the scan clock signal and the clock signal, so that a short current occurring when all the clock signals are '1' is prevented.

9. The clocked-scan flip-flop of claim 8, wherein the short prevention unit comprises:
   a third inverter which inverts the scan clock signal; and
   a NOR gate which performs a NOR operation on the output of the third inverter and the clock signal and outputs the operation result to the fifth switch, the sixth switch, and the first inverter.

10. The clocked-scan flip-flop of claim 7, wherein the first and second inverters and the first and second controlled-inverters are devices having low threshold voltages and the NOR gate is a device having a high threshold.

11. The clocked-scan flip-flop of claim 8, wherein the short prevent unit comprises devices having low threshold voltages and the NOR gate is a device having a high threshold.

12. A multi-threshold flip-flop circuit comprising:
   a data input unit to invert externally-provided data, the data input unit including low-threshold devices;
   a scan-data input unit to invert externally-provided scan data, the scan-data input unit including low-threshold devices;
   a latch unit controlled to selectively latch data from the data input unit or the scan-data input unit, the latch unit including high-threshold devices; and
   a data output unit to output data latched by the latch unit, the data output unit including low-threshold devices.

13. The circuit of claim 12, wherein at least one of the data input unit and the scan-data input unit includes:
   a first low-threshold inverter to invert the respective externally-provided data or scan-data; and
   a second low-threshold inverter to re-invert the once inverted data.

14. The circuit of claim 13, wherein:
   the latch unit includes a first high-threshold logic device to operate upon the once-inverted externally-provided data, and
      a second high-threshold logic device, the output of which is connected to an input to the first high-threshold logic device at a first node, to operate upon the twice-inverted externally-provided data;
   the output of the first high-threshold logic device being connected to an input of the second high-threshold logic device at a second node; and
   the data output unit includes a third low-threshold inverter to invert and output data on the first node, and
      a fourth low-threshold inverter to re-invert and output data on the second node.

15. The circuit of claim 14, wherein the first and second high-threshold logic devices are inverts.

16. The circuit of claim 14, wherein
   the first and second high-threshold logic devices are NAND gates;
   the first NAND gate receiving a set signal at one input thereof and the once-inverted externally-provided data at the second input thereof; and
   the second NAND gate receiving a reset signal at one input thereof and the twice-inverted externally-provided data at the second input thereof.

17. The circuit of claim 12, further comprising:
   a switch unit interposed between the data and scan-data input units and the latch unit to selectively connect either data from the data input unit or scan-data from the scan-data input unit to said latch unit.

* * * * *